United States Patent [19]

Lindquist et al.

[11] Patent Number: 5,304,845
[45] Date of Patent: Apr. 19, 1994

[54] APPARATUS FOR AN AIR IMPINGEMENT HEAT SINK USING SECONDARY FLOW GENERATORS

[75] Inventors: Stephen E. Lindquist, Boylston; Douglas A. Bailey, Concord, both of Mass.

[73] Assignee: Digital Equipment Corporation, Maynard, Mass.

[21] Appl. No.: 954,608

[22] Filed: Sep. 30, 1992

Related U.S. Application Data

[63] Continuation of Ser. No. 682,772, Apr. 9, 1991, abandoned.

[51] Int. Cl.⁵ ............................................. H01L 25/04
[52] U.S. Cl. .................................. 257/722; 257/712; 257/721; 361/690; 361/694; 174/16.1; 174/16.3; 165/80.3
[58] Field of Search .................... 357/81, 82; 361/384, 361/385, 383; 174/16.3, 16.1; 165/80.3, 80.4; 257/715, 721, 722, 712

[56] References Cited

U.S. PATENT DOCUMENTS

| | | | |
|---|---|---|---|
| 2,535,721 | 12/1950 | Chausson | 257/263 |
| 2,984,774 | 5/1961 | Race | 317/234 |
| 3,147,801 | 9/1964 | Katz | 165/185 |
| 3,163,207 | 12/1964 | Schultz | 165/68 |
| 3,421,578 | 1/1969 | Marton | 165/186 |
| 3,435,891 | 4/1969 | Parrish | 165/121 |
| 4,009,752 | 3/1977 | Wilson | 257/722 |
| 4,296,455 | 10/1981 | Leaycraft et al. | 257/721 |
| 4,541,004 | 9/1985 | Moore | 357/81 |
| 4,638,858 | 1/1987 | Chu | 165/185 |
| 4,682,651 | 7/1987 | Gabuzda | 165/80.3 |
| 4,715,438 | 12/1987 | Gabuzda et al. | 165/185 |
| 4,733,293 | 3/1988 | Gabuzda | 357/81 |
| 4,823,869 | 4/1989 | Arnold et al. | 165/185 |
| 4,884,631 | 12/1989 | Rippel | 165/185 |
| 4,899,210 | 2/1990 | Lorenzetti et al. | 257/722 |
| 4,918,571 | 4/1990 | Grabbe | 361/386 |
| 4,964,458 | 10/1990 | Flint et al. | 257/722 |
| 5,019,880 | 5/1991 | Higgins, III | 357/81 |
| 5,043,845 | 8/1991 | McDermott et al. | 257/680 |
| 5,049,982 | 9/1991 | Lee et al. | 257/722 |
| 5,168,348 | 12/1992 | Chu et al. | 257/714 |

FOREIGN PATENT DOCUMENTS 0246432  11/1987  European Pat. Off. ........... 174/16.3

OTHER PUBLICATIONS

"Boundary-Layer Theory", Dr. Hermann Schlichting, 7th Ed., 1979, McGraw Hill, New York, Chapter 2, pp. 24–46.

*Primary Examiner*—Rolf Hille
*Assistant Examiner*—David Ostrowski
*Attorney, Agent, or Firm*—Albert P. Cefalo; Dirk Brinkman

[57] ABSTRACT

An apparatus is disclosed for fluid dynamically augmenting a heat sink to displace a boundary layer in the cooling fluid adjacent to the surfaces of the heat sink cooling fins. Ribs with a thickness slightly less than the thickness of the boundary layer cause secondary flow in the cooling fluid downstream from the rib in the form of vortices which displace hotter slower moving fluid by drawing in cooler fluid farther from the surface of the fins. The ribs are constructed on the surface of the cooling fins in an inverted V-shaped configuration. The angle of the ribs in the inverted V-shaped configuration is optimized to intersect the entire flow of the fluid through the heat sink forming a means for efficient dissipating heat from the heat sink over its entire surface area.

20 Claims, 4 Drawing Sheets

APPARATUS FOR AN AIR IMPINGEMENT HEAT SINK USING SECONDARY FLOW GENERATORS

This application is a continuation, of application Ser. No. 07/682,772, filed Apr. 9, 1991, now abandoned.

FIELD OF THE INVENTION

This invention relates to a cooling apparatus for semiconductor components and more particularly to a fluid dynamically augmented heat sink for the cooling of high power integrated circuit components.

BACKGROUND OF THE INVENTION

Modern digital computing equipment may use high-power, integrated circuit components mounted in dense configurations on narrowly spaced printed circuit boards placed inside compact equipment enclosures. Because of their fast speed, emitter-coupled logic (ECL) components are widely used in the industry. However, ECL components generate relatively large amounts of heat which can be as high as 65 watts per component. Heat sinks in thermal contact with such components are used to dissipate heat from the components.

Heat is normally convected from a heat sink by a cooling fluid such as air or water. Although air has a thermal conductivity and density which is lower than most fluids air cooling, is the simplest and least expensive method for removing heat from components. The cooling of high-power, integrated circuit components continues to offer a challenge for heat sink design, since the ability of heat sinks to disperse excess heat is a severe and practical design limitation for high performance circuits.

Factors which contribute to the cooling of a heat sink include: the thermal conductivity of the material used to construct the heat sink, the total surface area of the heat sink; the velocity of the cooling fluid and the fluid dynamic characteristics of the heat sink as it interacts with the flow of the fluid. The heat sink may be constructed with one or several cooling fins, in various configurations, mounted on a base in thermal contact with the circuit component. Increasing the height and number of cooling fins on a heat sink will increase the total surface area available for dissipating heat. However, increasing the height of the cooling fins and decreasing the spacing between the fins may create serious fluid dynamic problems with the heat sink.

The flow of a fluid near a substantially smooth surfaced plate is characterized by the growth of a thin, relatively slow moving, boundary layer. This boundary layer is created by the viscous drag of the stationary surface on the moving fluid. This boundary layer acts as an insulator that retards the convective heat-transfer process to faster moving and relatively cooler layers of the fluid further from the surface of the cooling fin.

In addition, the depth and narrowness of the troughs between the fins may create areas of flow stagnation that impede the flow of fluid at the center of the component precisely where the component is generally the hottest. This deterioration in heat transfer can be partially overcome by increasing the velocity of the fluid. There are two common systems used for cooling by air; high volume mass flow, where the velocity of the air is in the range of 2 to 4 meters per second, and low volume impingement, where the velocity of the air is in the range of 15 to 20 meters per second. In mass flow systems, air is generally blown parallel to the circuit board by fans mounted near the periphery of the enclosure. In impingement systems, high pressure air is directed perpendicularly at the heat sink through nozzles in a plenum plate placed in close proximity with the heat sink. With impingement systems the heat transfer rate can be improved by as much as a factor of two over conventional mass flow cooling. For example, some impingement air cooling systems dissipate heat at the rate of 65 watts per component or 4 watts/cm$^2$ of package surface area.

However, the heat transfer rate with impingement cooling is approximately proportional to the fourth root of the air pressure at the nozzle exit point. For example, to increase heat dissipation per component from 4 to 6 watts/cm$^2$ would require as much as a three fold increase in air pressure. Nozzle back pressure, acoustic emissions and enclosure design set practical limitations on the size of high pressure blowers used in computer systems.

U.S. patents attempting to overcome these limitations include: the use of complex fin combs (G. Chausson, U.S. Pat. No. 2,535,721, 1950); angular flanges on the cooling fins (R. T. Race, U.S. Pat. No. 2,984,774, 1961; L. Katz, U.S. Pat. No. 3,147,801, 1964; R. T. Schultz, U.S. Pat. No. 3,163,207, 1964); small fin segments in staggered arrangements (L. L. Marton, U.S. Pat. No. 3,421,578, 1969; P. G. Gabuzda, U.S. Pat. No. 4,682,651, 1987); angular flanges and baffles (F. W. Parrish, U.S. Pat. No. 3,435,891, 1969); circular pins (R. M. Moore, U.S. Pat. No. 4,541,004, 1985; R. C. Chu, U.S. Pat. No. 4,638,858, 1987); and a contoured base (A. J. Arnold, U.S. Pat. No. 4,823,869, 1989). None of these inventions consider the dynamics of the boundary layer the in cooling of the interface between the fluid and the surface. Understanding the interaction of the fluid and the surface is necessary to design a compact fluid dynamically efficient heat sink.

SUMMARY OF THE INVENTION

The present invention improves the cooling of an integrated circuit component by fluid dynamically augmenting the surfaces of the fins of the heat sink. In accordance with the invention ribs are constructed on the surfaces of the cooling fins to displace a boundary layer in the fluid flowing immediately adjacent to the surface of the fins. The ribs generate secondary flows downstream from the ribs in the form of vortices. These vortices mix hotter fluid in the boundary layer and convect high velocity fluid from the middle of the trough to the surface of the fin. However, the ribs are not so large as to completely impede the flow of the air along the cooling surfaces.

In accordance with another aspect of the invention the fluid dynamic characteristics of the heat sink are further improved by placing the ribs in an inverted V-shaped configuration. This configuration, with the apex of V centrally located with respect to the length of the fin, and near the source of the cooling fluid, is optimal for impingement systems where the air is directed perpendicularly at the circuit components.

These and other features and advantages of the present invention will become apparent from a reading of the detailed description in conjunction with the attached drawings in which like reference numerals refer to like elements in the several views.

DETAILED DESCRIPTION OF THE PREFERRED EMBODIMENT

Figure 1:
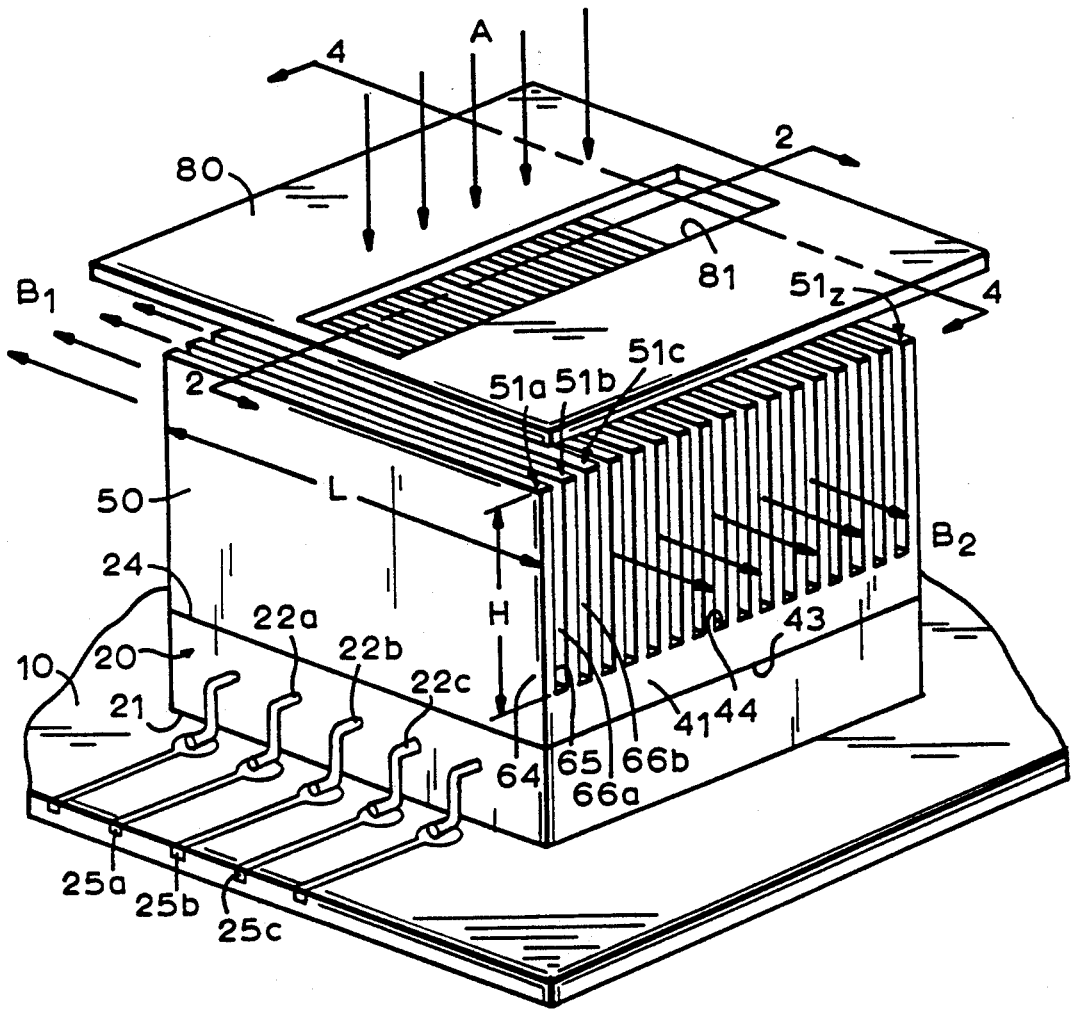
FIG. 1 is a view of an assembly including the heat sink according to the invention attached to a component mounted on a circuit board showing air flow.

Referring now to the drawings, and particularly to FIG. 1, there is shown a circuit component 20 mounted on a printed circuit board 10. The printed circuit board 10 is typically installed in an air-cooled enclosure with many other parts which are not shown for clarity. The circuit component 20 may contain, by way of example CMOS or BIPOLAR VLSI circuits capable of generating heat energy in excess of 100 watts per component. This heat must be removed to assure that the circuit will function within its design constraints, and to prevent the destruction of the circuit from overheating.

Component 20 has an under side 21, an upper side 24 and electrical contact pins, some of which are labeled 22a-22c, emanating, by way of example, from the edge thereof. The contact pins 22a-22c are suitably secured, such as by soldering to solder pads, some of which are labeled 25a-25c, on the surface of the printed circuit board 10. Although there may be some heat loss from component 20 through contact pins 22a-22c to solder pads 25a-25c or to the air, the major portion of the heat must be removed from upper side 24.

Therefore, a heat sink 50 is intimately bonded to the upper side 24 of component 20 so that component 20 is in heat transfer relationship with heat sink 50. The heat sink 50 is comprised of a heat conducting mounting base 41 having a bottom face 43 and top face 44. The bottom face 43 is in thermal contact with upper side 24 of the component 20. The dimensions of upper side 24 of component 20 will generally be identical to the dimensions of the bottom face 43 of the mounting base 41, which, as shown in the drawings, is of a generally rectangular configuration.

Emanating vertically (as viewed in FIG. 1) from the top face 44 of the mounting base 41 are a plurality of spaced generally identical, generally rectangular plate-like cooling fins, some of which are labeled 51a-51c. Each of the cooling fins 51a-51c has a predetermined height and length, labeled H and L respectively in FIG. 1. By way of example, the height and length of the cooling fins in the present invention are 17.7 mm and 42 mm respectively. The side surfaces of each cooling fin define a pair of oppositely facing cooling surfaces, some of which are labeled 64, 65. The space intermediate facing surfaces of adjacent fins define air passage troughs, such as troughs 66a and 66b intermediate fins 51a-51b, and 51b-51c respectively. The cooling fins 51a-51c facilitate cooling of the heat sink 50 by increasing the total surface area of the heat sink 50. As will be apparent to those skilled in the art, the parallel fin placement of the cooling fins 51a-51c is but one configuration of the cooling fins 51a-51c and any convenient fin placement may be utilized.

A substantially flat, generally rectangular plenum plate 80 is mounted above and in close proximity to the heat sink 50 in a plane parallel to mounting base 41. The plenum plate 80 having a rectangular slot or cut-out for defining an air passage nozzle 81. The long axis of nozzle 81 is perpendicular to the plane of cooling fins 51a-51c and is approximately centered above the cooling fins 51a-51c. The nozzle 81 has a predetermined width and length dimensioned to maximize the velocity of fluid flow through the heat sink 50. The length of the nozzle 81 is generally selected to ensure flow of air along all surfaces of cooling fins 51a-51c, that is, the long axis of the nozzle is approximately the same dimension as the distance from the first fin 51a to the last fin 51z. The width of nozzle 81 is generally selected to be 20 to 30 percent of the length L of cooling fins 51a-51c. As will be apparent to those skilled in the art, the plenum plate with a slot as defined herein is but one configuration for cooling fluid delivery, any convenient fluid delivery means may be utilized.

A fluid, such as high pressure impinging air, may be directed through nozzle 81, in a direction perpendicular to mounting base 41, as shown by the arrows labeled A in FIG. 1. A static pressure rise from air striking the mounting base 41 splits the air into two distinct flows, each approximately equal in volume. The deflected air flow is thus rotated through 90° to exit the heat sink 50 in a direction essentially parallel to the mounting base 41, as shown by arrows labeled $B_1$ and $B_2$ in FIG. 1. Heat is dissipated from the cooling fins 51a-51c to the air in immediate contact with the cooling surfaces 64, 65.

Figure 2:
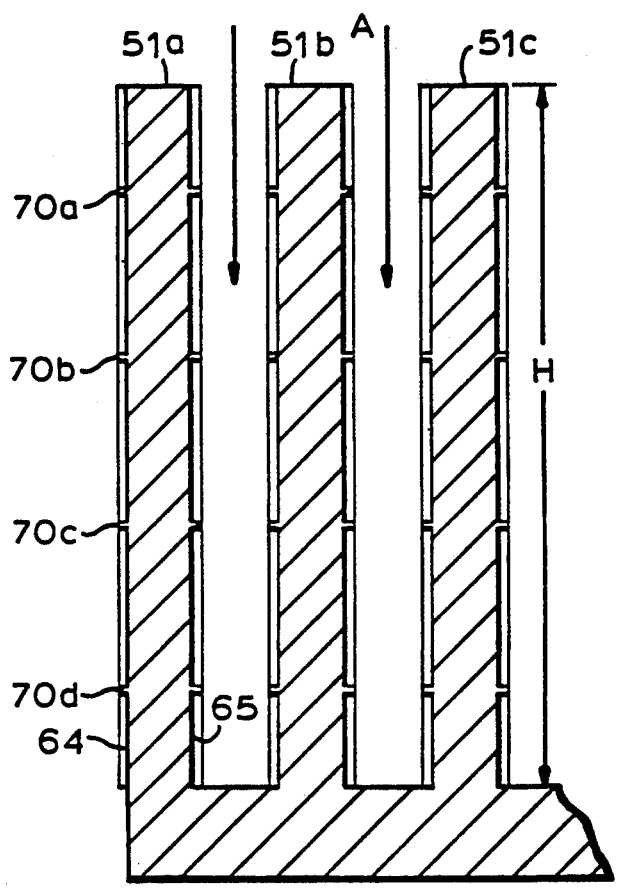
FIG. 2 is a cross-sectional view, partially cutaway, of the heat sink used in the assembly of FIG. 1, as viewed along line 2—2 in FIG. 1.

Referring now to FIGS. 2, there are shown, emanating perpendicular to the surfaces of cooling fins 51a-51c a plurality of spaced generally identical, generally square cross-sectional ribs, some of which, on one of the surfaces 64 of the fin 51a, are labeled 70a-70d. It should be understood, that the ribs 70a-70d have not been shown in FIG. 1 only for clarity of the drawing of the assembly. For reasons that will become apparent, the ribs 70a-70d are placed to intersect the plane of the air flow along the surface of the fin diagonally.

Figure 3:
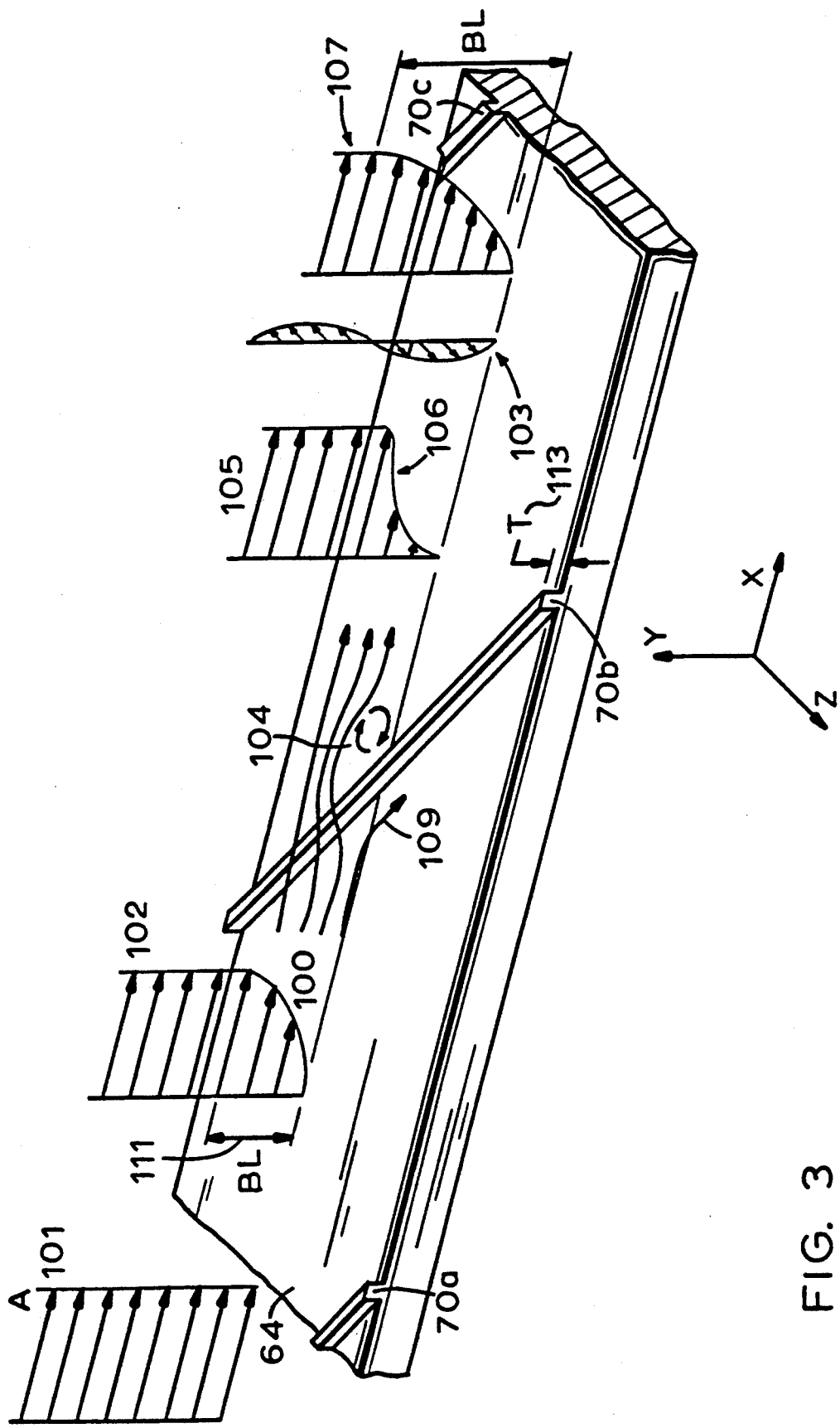
FIG. 3 is a cross-sectional view, partially cutaway, of a fin of a heat sink used in the assembly of FIG. 1, showing, as viewed along line 2—2 in FIG. 1, the secondary flow effect of the ribs on the surface of a cooling fin.
Figure 5:
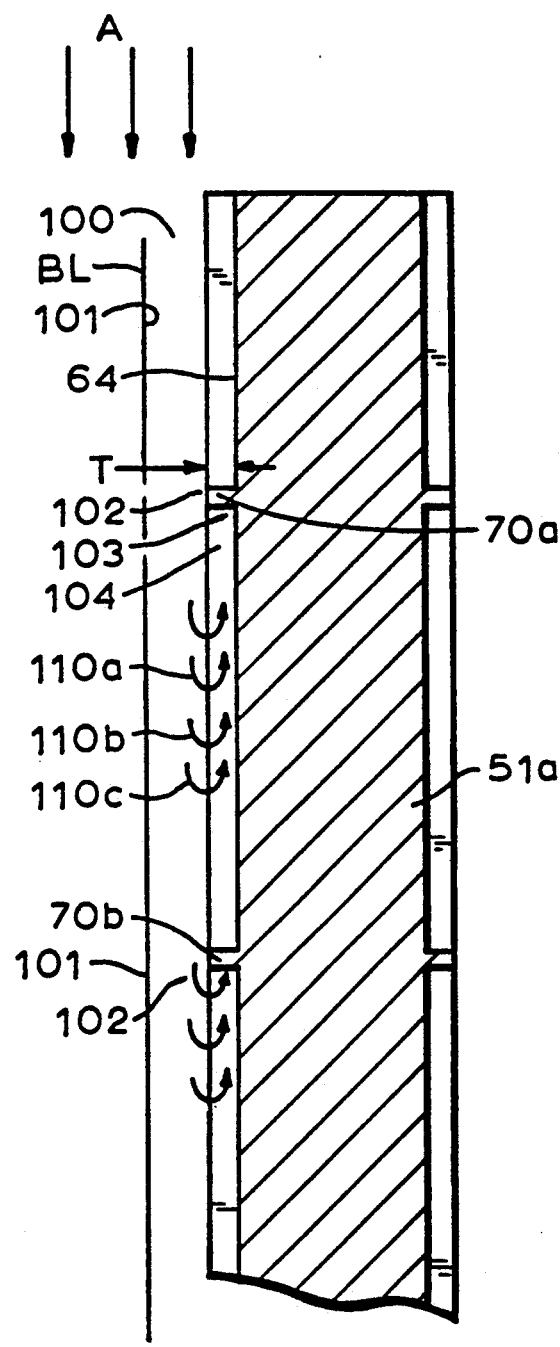

Referring also to FIG. 3, fluid as shown by arrows labeled A has an initial velocity profile as shown by 101. The flow of the fluid near a substantially smooth surface 64 is characterized by the growth of a relatively slow moving boundary layer, generally designated 100 between surface 64 and line BL and having a velocity profile 102. This boundary layer 100 is created by the viscous drag of the stationary surface 64 on the moving fluid A. The relatively hotter fluid in the boundary layer 100 acts as an insulator and retards the transfer of heat from the surface 64 to the fluid. Heat transfer in a heat sink can be improved by displacing this boundary layer 100 away from the cooling surface.

The rib 70b causes the displacement of the boundary layer 100 by forcing the flow in the boundary layer to travel over the rib 70b. Low velocity air, in the region generally designated by reference numeral 109, near the surface 64 is unable to overcome the pressure forces created by the rib 70b and is deflected from the main flow direction. This contributes to the secondary flow pattern generally indicated by reference numeral 103. In addition, as fluid passes over the rib 70b a stationary eddy 104 is created. This is a region of high temperature and low velocity fluid and its effect is to reduce heat transfer immediately downstream of the rib 70b. This region is small however, and is limited to one to two rib heights downstream of the rib 70b. Diffusion of momentum causes the flow to reattach to the surface 64 with the resulting velocity profile 105. The large velocity gradient as indicated by numeral 106, the secondary flow profile 103 and the mixing of cooler fluid from outside the boundary layer 100 all contribute to locally enhance the heat transfer rate from the surface 64 to the fluid. As the fluid flows downstream, the normal velocity profile 102 begins to redevelop as indicated by profile 107 until it is interrupted by rib 70c and the process is repeated. The positive effect of boundary layer reattachment as indicated by profile 105 significantly outweigh the negative effects of the eddy 104 when the ribs 70a-70c are optimally spaced at a distance of 20 to 35 rib heights. By way of example, in the present invention maximum displacement of the boundary layer 100 is observed with the thickness of the ribs being in the range of about 0.4 to 0.7 times the thickness of the boundary layer, the thickness of the rib is defined as the distance from the surface 64 of the fin 51a to the distal end of the rib 70a protruding into the boundary layer 100, as shown by the line labeled T 113 in FIG. 3. In order to calculate the thickness 111 of a boundary layer 100 in a fluid flowing along a flat plate it is required that use be made of the following formula, as expressed in "Viscous Fluid Flow" by F. M. White, McGraw-Hill Co., New York, 1974, page 247:

$$T_b = \frac{1.72 \times L_b}{\sqrt{Re}}$$

where.

Figure 4:
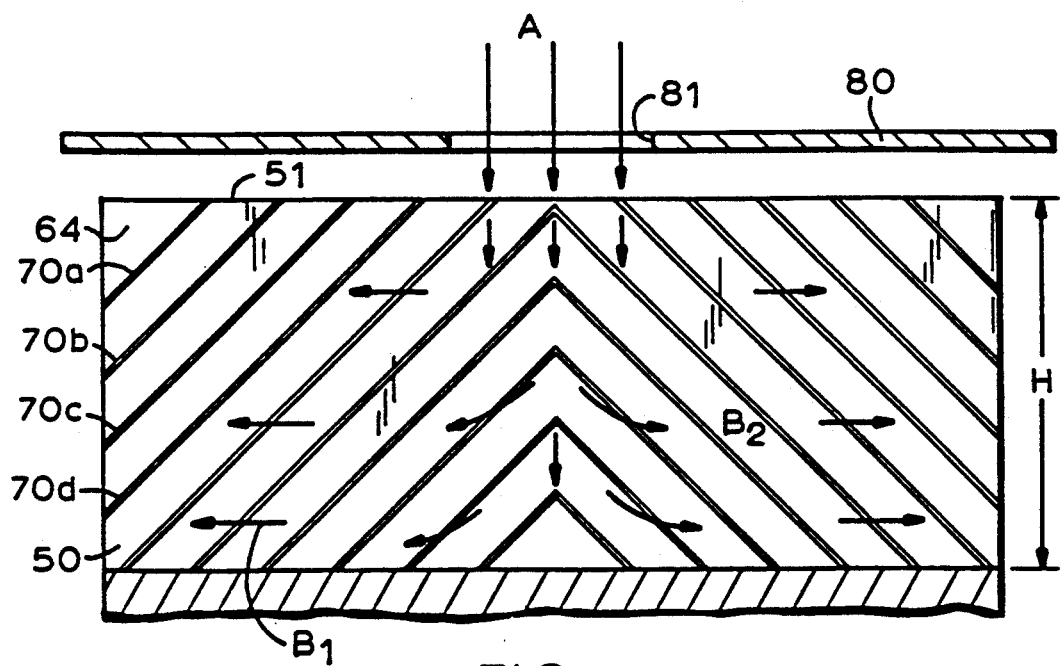
FIG. 4 is a planar view of a fin of the heat sink used in the assembly of FIGS. 1 and 2, showing in cross-section, as viewed along line 4—4 in FIG. 1, the plenum plate and an augmented impingement air cooling effect.

$T_b$ = thickness of the boundary layer
$L_b$ = characteristic path length of the boundary layer
$Re$ = Reynolds number. For the purpose of this invention, and as generally shown in FIG. 4 by arrows labeled A, B1 and B2, the characteristic path length $L_b$ of a boundary layer in a fluid which is initially directed at the center of a rectangular fin 51, in a plane parallel to the short axis of the fin 51, deflected by the mounting base 41 through an angle of 90° and exiting in a direction parallel to the long axis of fin 51 can approximately be expressed as:

$$L_b = H + L/2$$

where
H = the height of fin
L = the length of fin. Therefore, by substitution and reduction the above formula may be expressed as:

$$T_b = \frac{1.72 \times (H + L/2)}{\sqrt{Re}}$$

The Reynolds number, Re, which is the ratio of inertial to viscous forces in a fluid, for a flat plate may be calculated by the following formula:

$$Re = \frac{V \times L_b}{nu}$$

where
V = the fluid velocity
nu = the fluid kinematic viscosity

Thus, by way of example, to compute the optimal thickness for a rib for a cooling fin in the present invention, using the above formulas where:
H = 0.0177 meters (17.7 mm)
L = 0.042 meters (42 mm)
V = 15 meters per second
nu = 0.00001684 meter$^2$ per second for air at 300° Kelvin (27° C.) gives a boundary layer thickness $T_b$ of 0.358 mm. The fluid kinematic viscosity nu is given in "Analysis of Heat and Mass Transfer" by E. Eckert & R. Drake, McGraw-Hill Co., New York, 1972, page 780. Therefore, the ribs in the present invention should be constructed with a thickness in the range of about 0.14 to 0.25 mm.

Referring again to FIG. 2, the displacement of the boundary layer along the entire path of the fluid flow along the cooling surface can be maximized by optimally placing additional ribs within the effected downstream region of the previous rib. The ribs 70a-70d essentially cause the fin to be broken into fluid dynamically distinct segments, maximizing the heat transfer from each cooling surface 64, 65 of the cooling fins 51a-51c. By way of example, the optimum displacement of the boundary layer occurs in this invention when the distance between successive ribs is in the range of about 20 to 25 times the thickness of the rib.

Now referring to FIG. 4, the flow of air is generally indicated by arrows labeled respectively A, B$_1$ and B$_2$. Air is directed at heat sink 50 in a plane perpendicular to mounting base 41 by passing through the nozzle 81 in plenum plate 80, as shown by arrows labeled A in FIG. 1. The nozzle 81 is essentially centered above the heat sink 50 and has width and length dimensions as described herein to optimize fluid pressure and volume. A static pressure rise from the mounting base 41 on the air causes the air flow to be split into approximately two halves. Each half exiting the heat sink 50 in opposing directing and in a plane essentially parallel to the mounting base, as shown by arrows labeled B$_1$ and B$_2$ in FIG. 4. In other words, the air flow enters the troughs 66a-66b of the heat sink 50 perpendicular to the mounting base 41, is then rotated through an angle of approximately 90°, and exits the heat sink 50 troughs 66a-66b parallel to the mounting base 41. The cooling effect described herein can be observed when the ribs 70a-70d intersect the plane of the flow of air at angle which is approximately greater than 30° and less than 60°.

It will be seen that ribs 70a-70d placed in an inverted V-shaped configuration centered on an axis perpendicular to the widthwise center line of the mounting base 41 optimally intersect the flow of air. Therefore, when the air flow is initially in a direction perpendicular to the mounting base 41, and then is deflected through an angle of approximately 90° to exit the heat sink 50 in a direction parallel to the mounting base 41, the angle between the arms in the inverted V-shaped configuration should be approximately 90° to maximize the boundary layer displacement effect over the entire surface of the cooling fin 51a-51c.

Furthermore, the total surface area of the heat sink 50 can be increased by increasing the number of fins 51a-51z in the heat sink 50. Additional fins can be placed on the mounting base 41 by decreasing the spacing between fins. However, if the fins 51a-51z are spaced too close together, the air flow will be severely restricted. The flow of fluid between the two adjacent fins 51a and 51b in the trough 66a will not be retarded if the spacing between the two adjacent fins 51a and 51b is at least twice the thickness of the boundary layer. To maximize the total surface area for fins 51a–51z and ribs 70a–70d constructed as described herein, the spacing between the fins 51a–51z should take into consideration the thickness of the ribs 70a–70d protruding out from the surfaces.

Therefore, by way of example, the spacing between adjacent fins should be at least twice the thickness of the boundary layer plus twice the thickness of the ribs. For air impingement systems having a fluid flow which is high in velocity and low in viscosity the optimal fin spacing is generally less than which is easily attainable with inexpensive manufacturing techniques such as extrusion, screw machining or slitting saws. Thus, manufacturing techniques may determine the minimum fin separation. However, for low velocity mass air flow systems, or systems using more viscous cooling fluids such as water the optimal fin separation may be determined by calculating the thickness of the boundary layer and the ribs as described herein.

It should be apparent to one skilled in the art that the thickness and configuration of the ribs on the surface of the cooling fins can be adapted to maximize the fluid dynamic characteristics of the heat sink for a variety of fluids, including air and water. The ribs on the cooling surfaces of the cooling fins can also be adapted to optimize the flow of fluids for a variety of nozzle sizes, nozzle placements and nozzle pressures. Furthermore, the ribs can be adapted to optimize fluid flowing through a heat sink with a variety of cooling fin dimensions and mounting base sizes.

In a preferred manufacturing method, the heat sink mounting base 41 and cooling fins 51a–51z are composed of a heat conductive material, by way of example copper. The ribs 70a–70d are stamped onto the surfaces of the cooling fin 51a–51z in an inverted V-shaped configuration. The fins 51a–51z are then either soldered or furnace brazed to a pre-cut mounting base 41 to form a heat sink assembly which is capable of being attached to a high power density integrated circuit component 20.

The fluid dynamically augmented heat sink 50 described herein has demonstrated a heat dissipation rate which is substantially higher than what is currently available when used with air impingement cooling. Also, by appropriately aligning the ribs 70a–70d on the surfaces of the cooling fins 51a–51z to intersect the air flow, the longitudinal vortex effect is maximized. The ribs 70a–70d also increase the total surface area of the cooling fin by approximately 5 per cent. Furthermore, the present invention allows for closer spacing of cooling fins of a greater height which also increases the heat dissipation efficiency of the heat sink 50. The roughening of the cooling surfaces of the cooling fins 51a–51z with a configuration of ribs 70a–70d increases the convection coefficient by a factor as high as 1.5 times the value for smooth surfaces. A fluid dynamically efficient heat sink as described herein extends the range of inexpensive impingement air cooling systems particularly to permit the use of power density integrated circuit components such as ECL devices that may dissipate heat in excess of 100 watts per component.

While the present invention has been shown and described with particularity to a preferred embodiment therefor, it will be understood by those skilled in the art that the foregoing and other changes in form and detail may be made therein without departing from the spirit and scope of the present invention.

What is claimed is:

1. A heat sink for cooling an integrated circuit component, said heat sink cooled by a moving fluid having a characteristic boundary layer of a predetermined thickness, said boundary layer formed in said moving fluid by the flow of said moving fluid over surfaces of said heatsink, said boundary layer adjacent to said surfaces, the thickness of said boundary layer proportional to the velocity of said fluid and the area of said surfaces, and the thickness of said boundary layer inversely proportional to the Reynolds number of said fluid, said heatsink comprising:

a thermally conductive mounting base in heat transfer contact with said component;

at least one thermally conductive fin on said mounting base and said fin having oppositely facing surfaces, said moving fluid flowing over said oppositely facing surfaces;

thermally conductive rib means formed on said oppositely facing surfaces, said rib means dimensioned, configured and arranged for displacing said boundary layer to improve heat flow from said fin to said moving fluid by creating secondary flows in said boundary layer, said rib means having a thickness less than the thickness of said boundary layer and intersecting the direction of flow of said moving fluid.

2. The heat sink according to claim 1 wherein the thickness of said rib means is within a range of about 0.4 to 0.7 times the thickness of said boundary layer.

3. The heat sink according to claim 1 wherein said rib means intersects the direction of flow of said fluid in said boundary layer at an angle within the range of about thirty to sixty degrees.

4. A heat sink for cooling an integrated circuit component, said heatsink cooled by a moving fluid having a characteristic boundary layer of a predetermined thickness, said boundary layer formed in said moving fluid by the flow of said moving fluid over surfaces of said heatsink, said boundary layer adjacent to said surfaces, said heatsink comprising:

a thermally conductive mounting base capable of being in heat transfer contact with said component;

at least one thermally conductive fin on said mounting base and said fin having oppositely facing surfaces, said moving fluid flowing over said oppositely facing surfaces;

thermally conductive rib means formed on said oppositely facing surfaces, said rib means dimensioned and arranged for displacing said boundary layer to improve heat flow from said fin to said moving fluid by creating secondary flows in said boundary layer, said rib means having a thickness less than the thickness of said boundary layer and having an inverted V-shaped configuration.

5. The heat sink according to claim 4 wherein the central axis of said inverted V-shaped configuration is generally perpendicular to said mounting base and the fluid flow is on said axis.

6. A heat sink for cooling an integrated circuit component, said heatsink cooled by a moving fluid having a characteristic boundary of having a predetermined thickness, said boundary layer formed in said moving fluid by the flow of said moving fluid over surfaces of said heatsink, said boundary layer adjacent to said surfaces, the thickness of said boundary layer proportional to the velocity of said fluid and the area of said surfaces, and the thickness of said boundary layer inversely proportional to the Reynolds number of said fluid, said heatsink comprising:

a thermally conductive mounting base capable of being in heat transfer contact with said component;

at least one thermally conductive fin on said mounting base and said fin having oppositely facing surfaces, said moving fluid flowing over said oppositely facing surfaces; thermally conductive rib means formed on said surfaces, said rib means dimensioned, configured and arranged for displacing said boundary layer to improve heat flow from said fin to said moving fluid by creating secondary flows in said boundary layer, said rib means includes a plurality of generally equally spaced, generally identical ribs having a thickness less than the thickness of said boundary layer, said ribs intersecting the direction of flow of said moving fluid.

7. The heat sink according to claim 6 wherein said plurality of ribs having a thickness within the range of about 0.4 to 0.7 times the thickness of said boundary layer.

8. The heat sink according to claim 6 wherein said plurality of ribs are spaced from one another within the range of about 20 to 25 times the thickness of a rib.

9. The heat sink according to claim 6 wherein said plurality of ribs are in an inverted V-shaped configuration.

10. An apparatus for cooling an integrated circuit component comprising:
a) a heat sink having
 i) a thermally conductive mounting base capable of being in heat transfer contact with said component;
 ii) at least one thermally conductive fin on said mounting base and said fin having oppositely facing surfaces;
b) means for directing a cooling fluid at said surfaces in a direction generally parallel to said surfaces;
c) a plurality of spaced generally equally, generally identical thermally conductive ribs formed on said surfaces in an inverted V-shaped configuration, dimensioned and arranged for displacing a boundary layer in said fluid, said plurality of ribs having a thickness less than the thickness of said boundary layer and intersecting the direction of flow of said fluid at an oblique angle.

11. The apparatus according to claim 10 wherein the thickness of said plurality of ribs is within a range of about 0.4 to 0.7 times the thickness of said boundary layer.

12. The apparatus according to claim 10 wherein said plurality of ribs are spaced from one another within the range of about 20 to 25 times the thickness of a rib.

13. An apparatus for cooling an integrated circuit component comprising:
a) a heat sink having
 i) a thermally conductive mounting base capable of being in heat transfer contact with said component;
 ii) a plurality of generally identical spaced, generally thermally conductive fins on said mounting base, said fins having oppositely facing surfaces, said surfaces on adjacent ones of said fins defining a trough;
b) a source of cooling fluid;
c) means for directing said fluid at and into said troughs;
d) a plurality of spaced generally equally, generally identical thermally conductive ribs formed on at least one of said surfaces defining said troughs, said ribs being in an inverted V-shaped configuration, said ribs dimensioned and arranged for displacing a boundary layer in said fluid, said ribs having a thickness less than the thickness of said boundary layer and being arranged on said surfaces for intersecting the direction of flow of said fluid at an acute angle;

said plurality of fins being spaced from one another on the same surface a distance of about two to four times the thickness of said boundary layer.

14. An apparatus according to claim 13 wherein the apex of said inverted V-shaped configuration of said ribs is nearer the source of said fluid.

15. An apparatus according to claim 13 wherein the apex of said inverted v-shaped configuration is on the center line of said surface.

16. A heat sink for cooling an integrated circuit component comprising:

a thermally conductive mounting base capable of being in heat transfer contact with said component;

at least one generally rectangular thermally conductive fin on said mounting base, said fin having oppositely facing surfaces;

thermally conductive ribs formed on said surfaces dimensioned, configured and arranged for displacing a boundary layer in a cooling fluid directed generally in a plane parallel to and over said surfaces, said ribs having a thickness which is less than the thickness of said boundary layer;

and the thickness of said boundary layer is $$\frac{V \times (H + L/2)}{\sqrt{Re}}$$

wherein V is the velocity of said fluid, H is the height of said fin, L is the length of said fin and Re is the Reynolds number of said fluid, enabling the cooling of said mounting base of said heat sink.

17. The heat sink according to claim 15 wherein the thickness of said ribs is within a range of about 0.4 to 0.7 times the thickness of said boundary layer.

18. The heat sink according to claim 15 wherein said ribs intersects the direction of flow of said fluid in said boundary layer at an angle within the range of about thirty to sixty degrees.

19. The heat sink according to claim 15 wherein said plurality of ribs are spaced from one another within the range of about 20 to 25 times the thickness of a rib.

20. The heat sink according to claim 15 wherein said plurality of ribs are in an inverted V-shaped configuration.

* * * * *